United States Patent
French et al.

(10) Patent No.: US 9,647,004 B2
(45) Date of Patent: May 9, 2017

(54) DISPLAY

(71) Applicant: E Ink Holdings Inc., Hsinchu (TW)

(72) Inventors: Ian French, Hsinchu (TW); Chi-Ming Wu, Tainan (TW); Po-Chun Chuang, Tainan (TW); Chun-Wei Chang, Hsinchu (TW); Kun-Lung Huang, Taichung (TW); Wu-Liu Tsai, Zhubei (TW); Pei-Lin Huang, Hsinchu (TW)

(73) Assignee: E INK HOLDINGS INC., Hsinchu (TW)

( * ) Notice: Subject to any disclaimer, the term of this patent is extended or adjusted under 35 U.S.C. 154(b) by 0 days.

(21) Appl. No.: 14/816,727

(22) Filed: Aug. 3, 2015

(65) Prior Publication Data

US 2016/0086978 A1    Mar. 24, 2016

(30) Foreign Application Priority Data

Sep. 23, 2014  (TW) .............................. 103132755 A
Mar. 12, 2015  (TW) .............................. 104107929 A (51) Int. Cl.

| H01L 27/14 | (2006.01) |
|---|---|
| H01L 27/12 | (2006.01) |
| H01L 25/16 | (2006.01) |
| G02F 1/1362 | (2006.01) |
| G02F 1/167 | (2006.01) |
| H01L 27/32 | (2006.01) |
| G02F 1/1368 | (2006.01) |

(52) U.S. Cl.
CPC .......... *H01L 27/124* (2013.01); *G02F 1/1362* (2013.01); *G02F 1/1368* (2013.01); *G02F 1/13624* (2013.01); *G02F 1/136286* (2013.01); *G02F 1/167* (2013.01); *H01L 25/16* (2013.01); *H01L 27/1214* (2013.01); *H01L 27/1218* (2013.01); *H01L 27/3244* (2013.01); *H01L 27/3248* (2013.01); *H01L 27/3288* (2013.01); *H01L 2924/0002* (2013.01)

(58) Field of Classification Search
None
See application file for complete search history.

(56) References Cited

U.S. PATENT DOCUMENTS

| 6,611,261 | B1 | 8/2003 | Zhang et al. |
|---|---|---|---|
| 6,927,818 | B2 | 8/2005 | Hinata et al. |
| 7,129,998 | B2 | 10/2006 | Ohgiichi et al. |
| 7,696,975 | B2 | 4/2010 | Yang et al. |
| 7,936,326 | B2 | 5/2011 | Hashimoto et al. |
| 8,159,431 | B2 | 4/2012 | Fujita et al. |
| 8,228,585 | B2 | 7/2012 | Sato |
| 8,319,930 | B2 | 11/2012 | Shimizu et al. |

(Continued)

FOREIGN PATENT DOCUMENTS

| TW | 201035659 A | 10/2010 |
|---|---|---|
| TW | 201044055 A | 12/2010 |
| TW | 201239489 A | 10/2012 |

OTHER PUBLICATIONS

Taiwanese Office Action dated Dec. 30, 2015.

*Primary Examiner* — Minh-Loan Tran
(74) *Attorney, Agent, or Firm* — Rabin & Berdo, P.C.

(57) ABSTRACT

A display is disclosed. The display includes a display panel including pixel units in an image-displaying region. Each of the pixel units includes an AND gate and a pixel electrode electrically connected to an output terminal of the AND gate.

15 Claims, 6 Drawing Sheets

(56) References Cited

U.S. PATENT DOCUMENTS

| | | |
|---|---|---|
| 8,441,014 B2 | 5/2013 | Yamazaki et al. |
| 8,477,092 B2 | 7/2013 | Neugebauer |
| 8,659,564 B2 | 2/2014 | Kim et al. |
| 2004/0252565 A1* | 12/2004 | Yamazaki ............ G09G 3/3233 365/202 |
| 2005/0030464 A1 | 2/2005 | Wang |
| 2006/0103323 A1 | 5/2006 | Eom et al. |
| 2007/0176176 A1* | 8/2007 | Yamazaki ............ G09G 3/3233 257/59 |
| 2007/0182691 A1 | 8/2007 | Na |
| 2008/0122804 A1* | 5/2008 | Kinoshita ............. G06F 1/3203 345/175 |
| 2009/0026452 A1* | 1/2009 | Miyaguchi .......... G02F 1/13624 257/59 |
| 2011/0012106 A1 | 1/2011 | Yamazaki et al. |
| 2012/0075268 A1 | 3/2012 | Chung et al. |
| 2012/0319623 A1 | 12/2012 | Cheng et al. |
| 2012/0319992 A1 | 12/2012 | Lee |
| 2013/0010015 A1* | 1/2013 | Yamauchi ............ G09G 3/3648 345/690 |
| 2013/0069992 A1 | 3/2013 | Huang et al. |
| 2013/0082914 A1* | 4/2013 | Matsumura ....... G02F 1/136209 345/92 |
| 2014/0042410 A1 | 2/2014 | Chen et al. |
| 2014/0078418 A1 | 3/2014 | Mu |

\* cited by examiner

DISPLAY

This application claims the benefit of Taiwan application Serial No. 103132755, filed on Sep. 23, 2014, and Taiwan application Serial No. 104107929, filed on Mar. 12, 2015, the subject matters of which are incorporated herein by reference.

TECHNICAL FIELD

The invention relates to a display.

BACKGROUND

Along with the development of display technology, the display panels have been widely used in many fields, such as various electronic products including mobile phones, Tablet PCs and digital cameras.

According to the conventional approach, a display panel is equipped with a driver chip, and wires are extended into the active region to provide signals to scan lines and data lines, which are orthogonally interlaced with each other. However, such approach requires a sufficient space in the periphery of the active region for accommodating the chip and the wires. As the design of electronic products is gradually directed towards slimness, lightweight and compactness, the conventional approach is disadvantageous for the realization of narrow-frame display panel.

Moreover, when a large amount of wires is used, the large amount of wires not only requires a large space but also causes extra problems such as the scan time being prolonged and the scan frequency being reduced, and ends up with insufficient charging time or charging rate.

SUMMARY

According to one embodiment, a display is disclosed. The display includes a display panel. The display panel includes a plurality of pixel units in an image-displaying region. Each of the pixel units includes an AND gate and a pixel electrode electrically connected to an output terminal of the AND gate.

According to another embodiment, a display is disclosed. The display includes a display panel. The display panel includes a plurality of pixel units in an image-displaying region. Each of the pixel units includes a first transistor, a second transistor and a pixel electrode. The first transistor and the second transistor are electrically connected in series. The pixel electrode is electrically connected to a source/drain of the second transistor.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
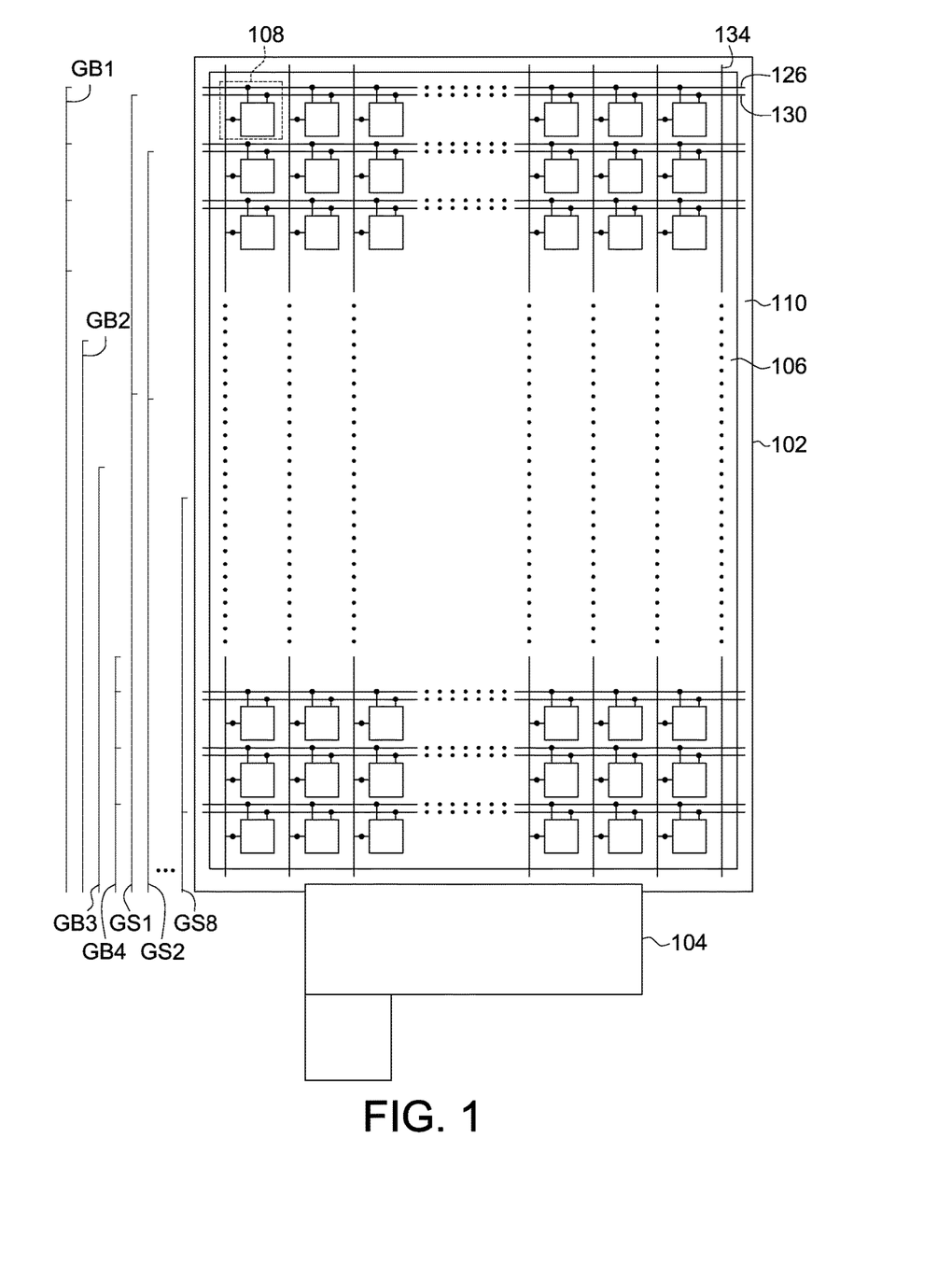
FIG. 1 is a schematic diagram of a display according to one embodiment.

FIG. 1 is a schematic diagram of a display according to one embodiment. The display includes a display panel 102 and a circuit board 104. The display panel 102 may be, for example, an electrophoretic display panel or a liquid crystal display panel, and include an array of pixel units 108 located in an image-displaying region 106. In one embodiment, the display is an electronic paper. The circuit board 104 may be a flexible circuit board bonded to a peripheral region 110 (non-displaying region) outside the image-displaying region 106 (active region), such as a chip-on-film (COF) board, a tape-automated bonding (TAB) board or a flexible printed circuit board, and can be folded to the back of the display panel 102.

Figure 2:
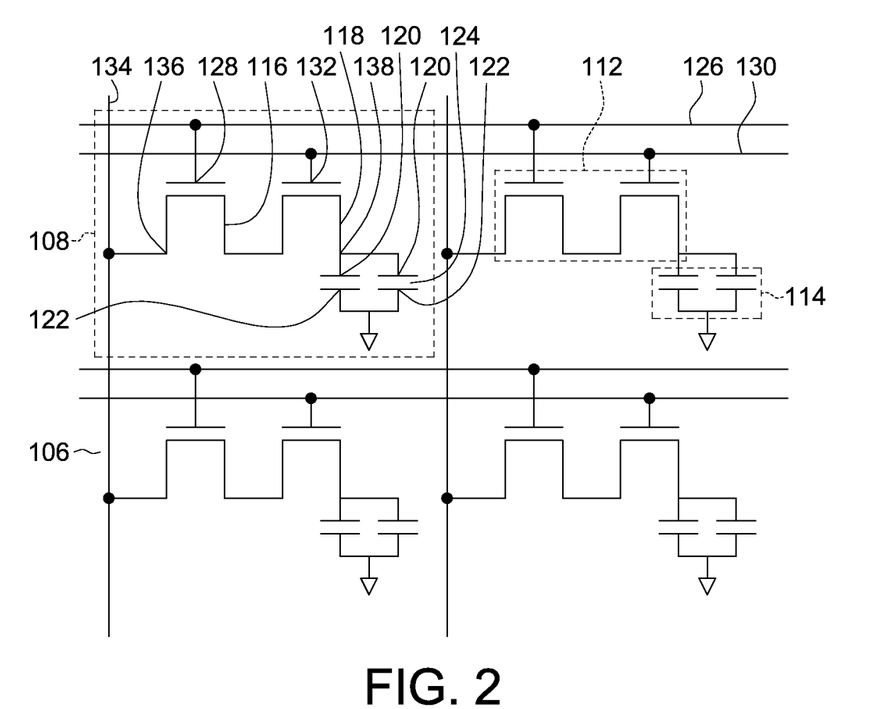
FIG. 2 is an enlarged view of pixel units according to one embodiment.

FIG. 2 is an enlarged view of four pixel units 108 according to one embodiment. Each pixel unit 108 include an AND gate 112 and a pixel element 114. The AND gate 112 may consist of a first transistor (TFT) 116 and a second transistor 118, which are electrically connected in series. An electrode pair of the pixel element 114 includes a pixel electrode 120 and a counter electrode 122 opposite to the pixel electrode 120. The electrode pair of the pixel element 114 can form a capacitor, and a liquid crystal or an electrophoretic element 124 may be interposed between the pixel electrode 120 and the counter electrode 122. The AND gate 112, used for controlling the ON/OFF of the pixel electrode 120, is disposed in the image-displaying region 106, and thereby does not occupy the space of the peripheral region 110 (FIG. 1). As such, the display panel 102 can be designed as a narrow-frame panel.

A horizontally arranged first conductive line 126 is electrically connected to a first input terminal of the AND gate 112, that is, the gate 128 of the first transistor 116. A horizontally arranged second conductive line 130 is electrically connected to a second input terminal of the AND gate 112, that is, the gate 132 of the second transistor 118. A vertically third conductive line 134 is electrically connected to an electrode terminal (or a data input terminal) of the AND gate 112, that is, the source/drain 136 of the first transistor 116. The single output terminal of the AND gate 112 (that is, the source/drain 138 of the second transistor 118) is electrically connected to both the pixel electrodes 120 of the electrode pair at the same time. The first conductive lines 126, the second conductive lines 130 and the third conductive lines 134 are electrically connected to the circuit board 104 (FIG. 1). The counter electrode 122 may be a common electrode, which is electrically connected a reference potential, such as connected to ground.

As exemplarily illustrated in FIG. 1, 32 conductive line groups are disposed in the image-displaying region 106, wherein each conductive line group consists of a horizontally arranged first conductive line 126 and a horizontally arranged second conductive line 130, and the adjacent conductive line groups are separated by the AND gates 112 (FIG. 2) and the pixel elements 114 disposed in a row. The 32 conductive line groups are electrically connected to the contact pads (not shown) of the circuit board 104 at the bottom through four block wires GB1 to GB4 and eight select wires GS1 to GS8, which extend in the left-hand side and/or the right-hand side of the peripheral region 110. The first conductive line 126 of the first group (the topmost group) is connected to the block wire GB1, and the second conductive line 130 of the first group is connected to the select wire GS1. The first conductive line 126 of the second group (the group under the first group) is connected to the same block wire GB1 to which the first conductive line 126 of the first group is connected, and the second conductive line 130 of the second group is connected to the select wire GS2. By the same analogy, the first conductive lines 126 of the third group to the eighth group are all connected to the same block wire GB1, and the second conductive lines 130 of the third group to the eighth group are sequentially connected to the select wires GS3 to GS8. The first conductive lines 126 of the $9^{th}$ group to the $16^{th}$ group are all connected to the same block wire GB2, and the second conductive lines 130 of the $9^{th}$ group to the $16^{th}$ group are sequentially connected to the select wires GS1 to GS8. The first conductive lines 126 of the $17^{th}$ group to the $24^{th}$ group are all connected to the same block wire GB3, and the second conductive lines 130 of the $17^{th}$ group to the $24^{th}$ group are sequentially connected to the select wires GS1 to GS8. The first conductive lines 126 of the $25^{th}$ group to the $32^{nd}$ group (the bottommost group) are all connected to the same block wire GB4, and the second conductive lines 130 of the $25^{th}$ group to the $32^{nd}$ group are sequentially connected to the select wires GS1 to GS8.

In the present embodiment, only 12 wires are disposed in the peripheral region 110 (four block wires GB1 to GB4 and eight select wires GS1 to GS8). In comparison to some comparative examples in which 32 block wires are disposed in the peripheral region 110 (two TFTs share a block wire, and the number of wires is: 4*8=32), the number of wires used in the present embodiment is largely reduced. It means that, according to the embodiment, the width (area) occupied by the wires in the peripheral region 110 (frame region which does not display images) is reduced. For example, the width occupied by 12 wires (wire width=10 μm, wire interval=10 μm) in the substrate of the display panel 102 is 240 μm, and the width occupied by 32 wires is 640 μm. Therefore, in comparison to the comparative example, the occupied width is reduced by 400 μm in the present embodiment. For example, the width occupied by 12 wires (wire width=5 μm, wire interval=5 μm) in the substrate of the display panel 102 is 120 μm, and the width occupied by 32 block wires is 320 μm. Therefore, in comparison to the comparative example, the occupied width is reduced by 200 μm in the present embodiment. Further, the larger the resolution level is, the larger the difference of width (area) between the present embodiment and the comparative examples will be. As such, the display of the present embodiment can be designed to have a narrower frame. Alternatively, the pitch between wires can be increased, such that the short-circuit problem caused by the deviation in the wire process can be reduced and product conformity rate can be increased.

As the number of wires is reduced, the contact pads of the circuit board 104 can correspondingly reduce. That is, the number of output signals for driving the IC chip is reduced. Therefore, the area of the chip can be reduced to benefit the development of small-sized displays. Particularly, as the aspect ratio of the chip is reduced, the risk of the chip being impaired will also be reduced. For example, when the COF board is used, the pitch limit currently achievable for the contact pad is 22 μm. Further, when the COF board is bonded on a TFT glass, the pitch limit for the contact pad is about 35 μm. Alternatively, the flexible printed circuit board (FPC) 104 applying the chip on glass (COG) technology can be used. Although the pitch limit for the contact pad of the COG is about 14 μm, which is smaller than that of the COF, the chip using the COG technology occupies the glass substrate in the peripheral region 110. Therefore, in view of achieving a narrower frame, it is more advantageous to use the COF in which the chip is not directly bonded on the substrate.

Further, according to the circuit design of one embodiment, a single output pad of the chip is electrically connected to the first conductive lines 126 or the second conductive lines 130 of different conductive line groups. Therefore, even when the micro-chip only has a limited number of output pads, the mobile display device with high resolution (pixel units) still can be realized. In addition, the manufacturing cost can be reduced by using fewer wires and a smaller chip.

Figure 3:
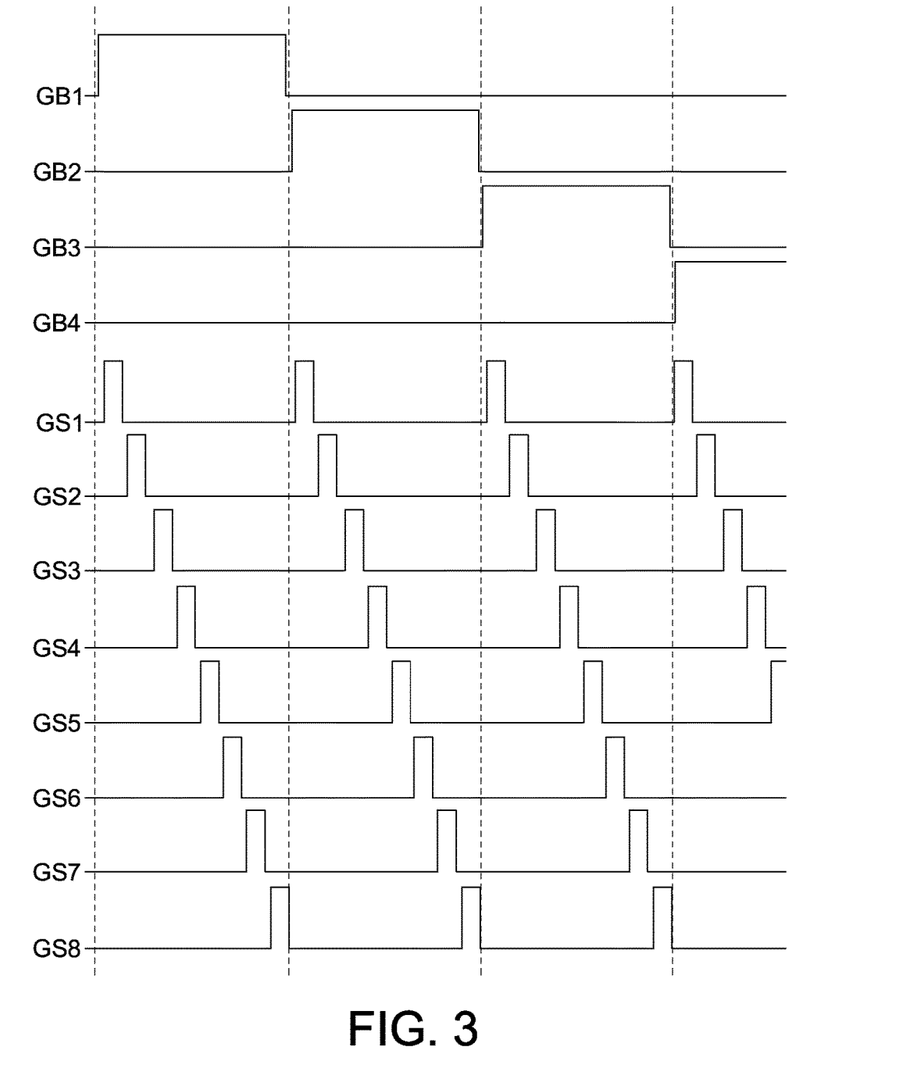
FIG. 3 is a signal waveform and timing diagram according to one embodiment.

The display of the present embodiment can classify and input gate signals in a multiplexing manner to control the ON/OFF status of the pixel electrode. FIG. 3 shows a signal waveform and timing diagram of block wires GB1 to GB4 and select wires GS1 to GS8 in a frame time according to one embodiment.

Referring to FIG. 3, the block wires GB1 to GB4 (or the first transistors 116 of the AND gates 112 which are electrically connected thereto through the first conductive lines 126 (FIG. 1 and FIG. 2)) are sequentially turned on, the width of respective pulse (or wide pulse timing signal) is a quarter of the frame time, and the pulses do not overlap. During the turn-on period of each of the block wires GB1 to GB4, the select wires GS1 to GS8 (or the second transistors 118 of the AND gates 112 which are electrically connected thereto through the second conductive lines 130 (FIG. 1 and FIG. 2)) are sequentially turned on, and the pulses (narrow pulse timing signal) do not overlap. In one embodiment, for example, the chip is driven by a scan frequency of 50 Hz, the frame time is 20 milliseconds (ms), the width of the wide pulse is 5 ms, and the width of the narrow pulse is 0.625 ms. In the condition that the block wire (or the first transistor 116) and the select wire (or the second transistor 118) of one single pixel unit 108 are turned on at the same time, the high-voltage signal of the third conductive line 134 will be outputted to the pixel electrode 120 via the turned-on AND gate 112. In the condition that at least one of the block wire (or the first transistor 116) and the select wire (or the second transistor 118) is turned off, the low-voltage signal will be outputted to the pixel electrode 120.

In the embodiment(s), by using the AND gate 112 consisting of the first transistor 116 (FIG. 2) and the second transistor 118, which are electrically connected in series, the ON/OFF status of the pixel electrode 120 of each pixel unit 108 can be determined in a multiplexing manner, and the problem of current leakage can be reduced when the pixel electrode 120 is turned off.

Referring to FIG. 1, the conductive line groups in the image-displaying region 106 are not limited to being 32 conductive line groups as described above, and do not have to work with the 4 block wires GB1 to GB4 and the 8 select wires GS1 to GS8. The circuit layout can be suitably adjusted according to actual needs of the products. For example, in another embodiment, the horizontally arranged first conductive lines 126 and second conductive lines 130 can constitute 256 conductive line groups, and 16 block wires and 16 select wires (not shown) can be used. The chip is driven by a scan frequency of 50 Hz, the frame time is 20 ms, the width of the wide pulse of the block wire is 1.25 ms, and the width of the narrow pulse of the select wire is 80 microseconds (μs). In an alternate embodiment, the horizontally arranged first conductive lines 126 and second conductive lines 130 can constitute 296 conductive line groups, and 19 block wires and 16 select wires can be used. The chip is driven by a scan frequency of 85 Hz, the frame time is 11.76 ms, the width of the wide pulse of the block wire is 0.62 ms, and the width of the narrow pulse of the select wire is 38.7 μs.

The AND gate can also be realized by other logic circuit capable of controlling output signals through pulse input signals. In other embodiments, the AND gate may consist of three or more than three transistors connected in series. The larger the number of the transistors connected in series is, the more significant the effect of reducing current leakage when the pixel electrode is turned off will be.

In some embodiments, the image-displaying region 106 may be divided into several sub-regions to shorten the scan time and increase the scan frequency.

Figure 4:
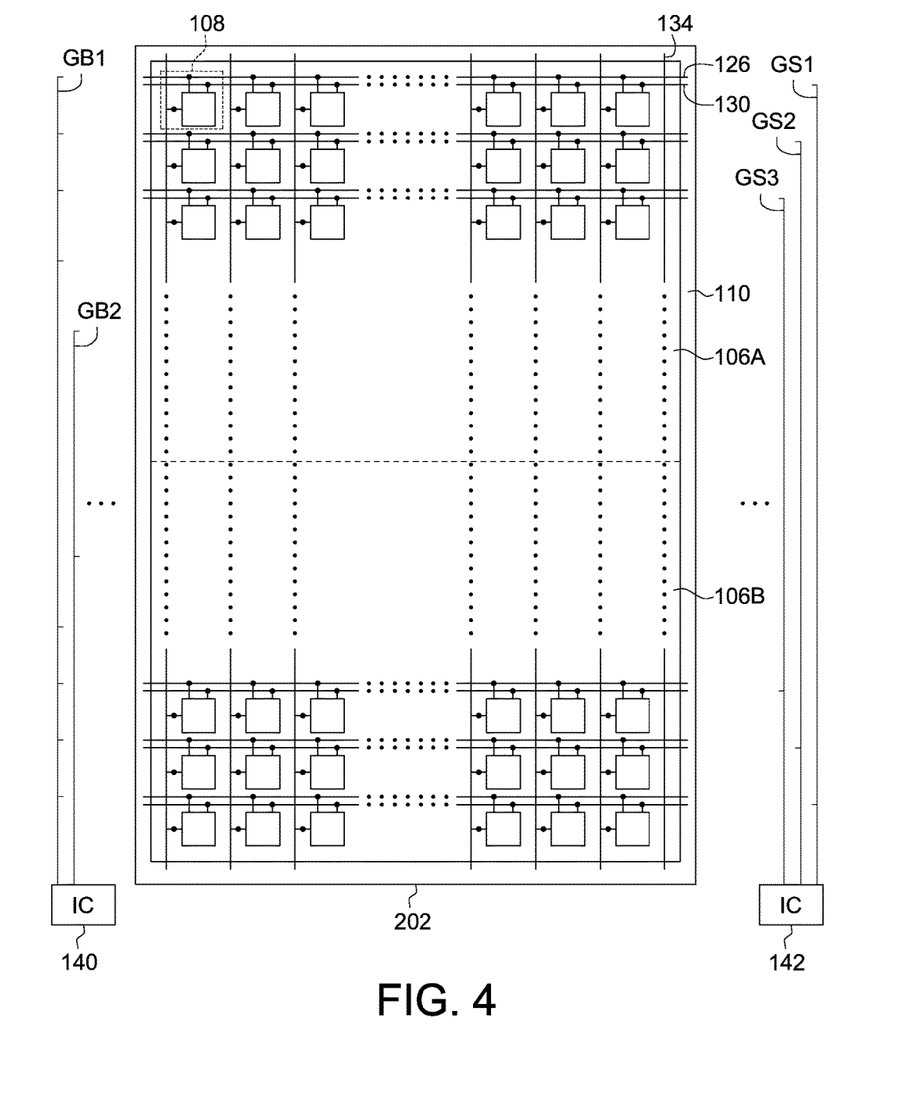
FIG. 4 is a schematic diagram of a display panel according to one embodiment.

Referring to FIG. 4, for example, the image-displaying region 106 of the display panel 202 is divided into a first sub-displaying region 106A at the upper part and a second sub-displaying region 106B at the lower part. Each of the first sub-displaying region 106A and the second sub-displaying region 106B has a number of horizontally arranged first conductive lines 126 and second conductive lines 130 and a number of vertically arranged third conductive lines 134. In the present embodiment, the block wire GB1 is electrically connected to the first conductive lines 126 of a pair of corresponding conductive line groups (in this case, the topmost conductive line group and the bottommost conductive line group), which respectively belong to the first sub-displaying region 106A and the second sub-displaying region 106B, at the same time, and the select wire GS1 is electrically connected to the second conductive lines 130 of said pair of corresponding conductive line groups at the same time. Based on this concept, the block wires GB1 to GB4 and the select wires GS1 to GS8 are disposed in a way similar to FIG. 1. Thus, the block wires GB1 to GB4 are electrically connected to the first conductive lines 126 of several pairs of corresponding conductive line groups (each pair comprises one belonging to the first sub-displaying region 106A and one belonging to the second sub-displaying region 106B) at the same time, and the select wires GS1 to GS8 are electrically connected to the second conductive lines 130 of several pairs of corresponding conductive line groups (each pair comprises one belonging to the first sub-displaying region 106A and one belonging to the second sub-displaying region 106B) at the same time. Any one of the block wires GB1 to GB4 and any one of the select wires GS1 to GS8 are electrically connected to only one pair of corresponding conductive line groups at the same time.

Through the area-dividing disposition disclosed above, a pair of corresponding conductive line group, which respectively belong to different areas, can be turned on at the same time. As such, the number of conductive lines/wires can be reduced. Besides, the scan time can be shortened, and thereby the problem of insufficient charging time or charging rate can be avoided. In one embodiment, the block wires GB1 to GB4 and the select wires GS1 to GS8 are disposed in a manner enabling the first sub-displaying region 106A and the second sub-displaying region 106B being scanned symmetrically at the same time. In one embodiment, the block wires GB1 to GB4 and the select wires GS1 to GS8 may be controlled by different IC chips 140 and 142. However, the disclosure is not limited thereto. For example, the block wires GB1 to GB4 and the select wires GS1 to GS8 can be controlled by the same IC chip. In one embodiment, the third conductive lines 134 in the first sub-displaying region 106A and the second sub-displaying region 106B may be controlled by different IC chips. In one embodiment, signals can be interrupted at the boundary between the first sub-displaying region 106A and the second sub-displaying region 106B to achieve a higher drive frequency.

In one embodiment, additional wires may be used to electrically connect different vertically disposed third conductive lines 134, such that the number of third conductive lines 134 that need to be connected to the circuit board 104 can be reduced.

Figure 5:
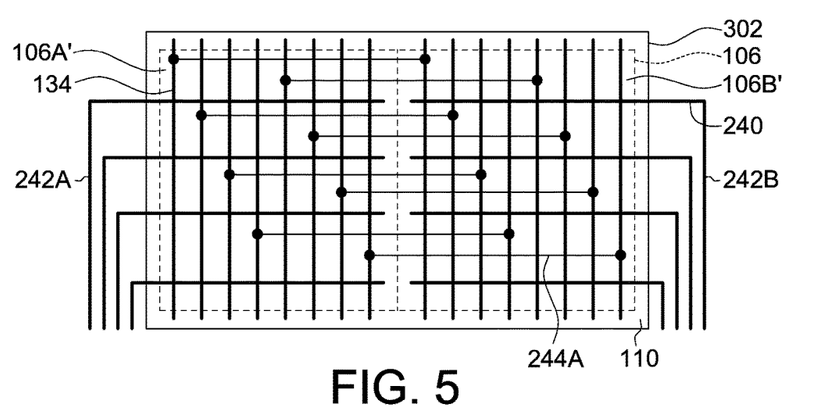
FIG. 5 is a schematic diagram of a display panel according to one embodiment.

Referring to FIG. 5, for example, the image-displaying region 106 of the display panel 302 is divided into a first sub-displaying region 106A' at the left-hand side and a second sub-displaying region 106B' at the right-hand side. Each of the first sub-displaying region 106A' and the second sub-displaying region 106B' has a number of horizontally arranged scan conductive lines 240 and a number of vertically arranged third conductive lines 134. Exemplarily but not restrictively, the scan conductive lines 240 may be the conductive line groups of FIG. 1, FIG. 2 or FIG. 4, wherein each conductive line group consists of a first conductive line 126 and a second conductive line 130. In some embodiments, the scan conductive lines 240 can be disposed along with the block wires and the select wires according to the present disclosure. Referring to FIG. 5, the scan wires 240 in the first sub-displaying region 106A' are connected to the peripheral wires 242A (such as the block wires/the select wires), which may be disposed at the left-hand side of the peripheral region 110. The scan wires 240 in the second sub-displaying region 106B' may be connected to the peripheral wires 242B at the right-hand side of the peripheral region 110.

The third conductive lines 134 in the first sub-displaying region 106A' and the second sub-displaying region 106B' are electrically connected to each other through the connection wires 244A, which cross the areas and are adjacent to the scan conductive lines 240. Therefore, by connecting the third conductive lines 134 in the first sub-displaying region 106A' to the circuit board (such as the circuit board 104 of FIG. 1), the electrical connection of the third conductive lines 134 in the first sub-displaying region 106A' and the third conductive lines 134 in the second sub-displaying region 106B' can be constructed at the same time. In other words, through the connection wires 244A crossing the areas, the number of third conductive lines 134 needed to be connected to the circuit board is reduced, so that the number of contact pads used in the circuit board can be reduced. That is, the number of output signals required for driving the IC chip is reduced. As such, the area of the chip can be reduced to benefit the development of small-sized displays. Particularly, as the aspect ratio of the chip is reduced, the risk of the chip being impaired will also be reduced. Further, according to the circuit design, one output pad of the chip is electrically connected to the third conductive lines 134 in different image-displaying regions at the same time. Therefore, although the micro-chip only has a limited number of output pads, the mobile display device with high resolution level (pixel units) and high scan frequency still can be achieved. The display panel 302 can be operated according to the multiplexing concept of the present disclosure.

Figure 6:
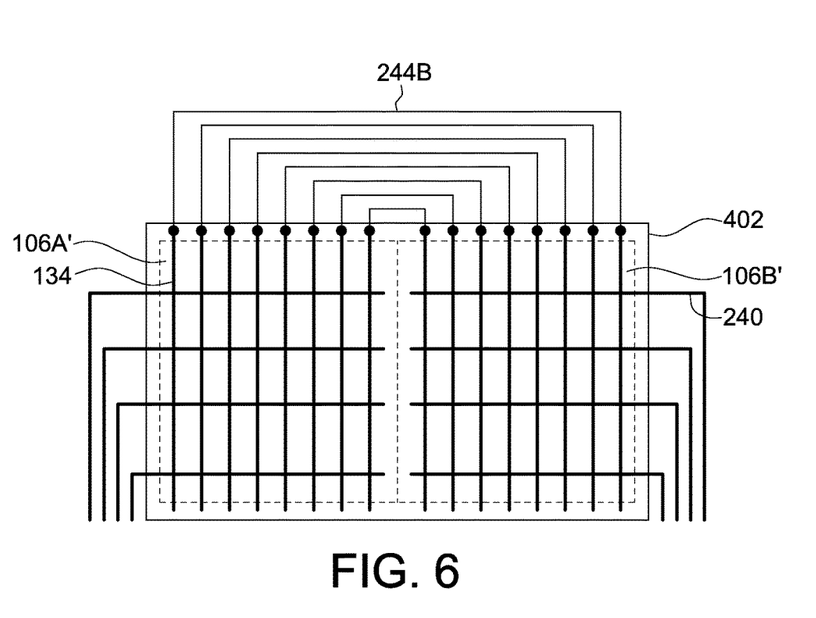
FIG. 6 is a schematic diagram of a display panel according to one embodiment.

The display panel 402 of FIG. 6 is different from the display panel 302 of FIG. 5 in that the third conductive lines 134 in the first sub-displaying region 106A' and the second sub-displaying region 106B' are electrically connected to each other through the connection wires 244B disposed above the scan conductive lines 240 (or at the rear side of the scan conductive lines 240). The display panel 402 can be operated according to the multiplexing concept of the present disclosure.

Figure 7:
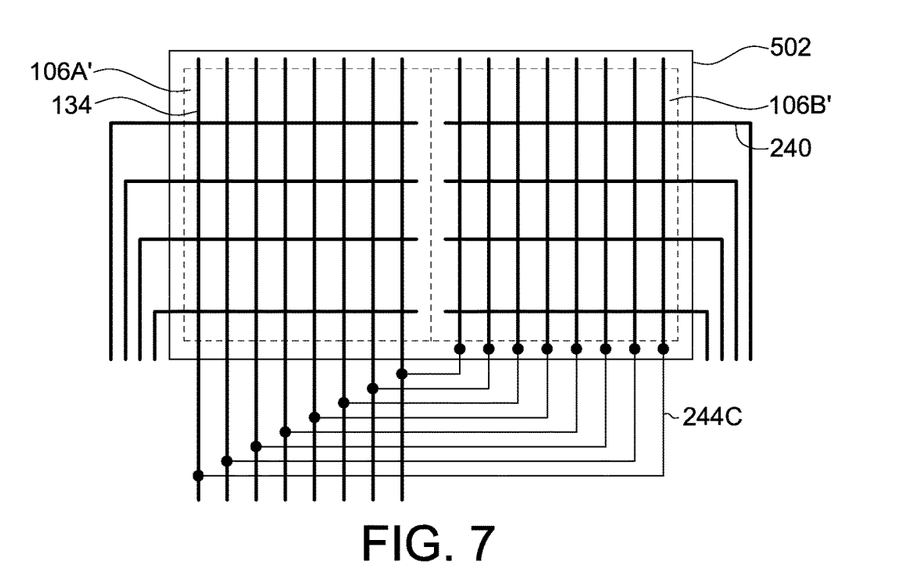
FIG. 7 is a schematic diagram of a display panel according to one embodiment.

The display panel 502 of FIG. 7 is different from the display panel 302 of FIG. 5 in that the third conductive lines 134 in the first sub-displaying region 106A' and the second sub-displaying region 106B' are electrically connected to each other through the connection wires 244C disposed under the scan conductive lines 240 (or at the front side of the scan conductive lines 240). The display panel 502 can be operated according to the multiplexing concept of the present disclosure.

A number of examples are provided below for describing the advantages of using the concepts of the embodiments. For example, each of the first sub-displaying region 106A' and the second sub-displaying region 106B' of the display panel has 128 third conductive lines and 128 conductive line groups. In other words, the display panel has 512 wires in total disposed thereon. In one embodiment, every two of the third conductive lines in different sub-displaying regions are connected through a connection wire, and only the third conductive lines in one of the first sub-displaying region and the second sub-displaying region (128 third conductive lines) are connected to the contact pads of the circuit board. Further, each of the left-hand side and the right-hand side of the display panel uses 16 block wires (that is, the left-hand side and the right-hand side use 32 block wires in total) to electrically connect the first conductive lines of different conductive line groups, and uses 8 select wires to electrically connect the second conductive lines of different conductive line groups (that is, the left-hand side and the right-hand side use 16 select wires in total). Therefore, there are 176 wires in total connected to the contact pads of the circuit board. In a comparative example, all of the first and second conductive lines in the conductive line groups and all of the third conductive lines are independently connected to the circuit board, and the circuit board correspondingly needs 512 contact pads. In comparison to the comparative example, the embodiments largely reduce the number of wires/conductive lines occupying the space of the peripheral region so as to realize the narrow-frame design. Besides, the embodiments correspondingly reduce the number of contact pads required in the circuit board, and accordingly reduce the size of the IC chip. Moreover, if the area-dividing concept of FIGS. 4-7 is used, the scan frequency can be increased and the problem of insufficient charging time or charging rate can be avoided.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A display, comprising:
   a display panel comprising:
      a plurality of pixel units in an image-displaying region, wherein each of the pixel units comprises an AND gate and a pixel electrode electrically connected to an output terminal of the AND gate;
      a plurality of conductive line groups, each of the conductive line groups comprising:
         a first conductive line electrically connected to a first input terminal of each of the AND gates in a row; and
         a second conductive line electrically connected a second input terminal of each of the AND gates in the row;
      a plurality of third conductive lines respectively electrically connected to an electrode terminal of each of the AND gates in a plurality of columns; and
      a wire in a peripheral region, the wire being connected to the first conductive lines of different conductive line groups at the same time, or connected to the second conductive lines of different conductive line groups at the same time, wherein the wire has an extending direction different from extending directions of the first conductive lines and the second conductive lines.

2. The display according to claim 1, wherein the image-displaying region comprises a first sub-displaying region and a second sub-displaying region, and the display panel further comprises:
   a block wire electrically connected to the first conductive lines of a pair of corresponding conductive line groups respectively belonging to the first sub-displaying region and the second sub-displaying region; and
   a select wire electrically connected to the second conductive lines of the pair of corresponding conductive line groups.

3. The display according to claim 1, wherein the image-displaying region comprises a first sub-displaying region and a second sub-displaying region, and the display panel further comprises:
   a plurality of block wires electrically connected to the first conductive lines of a plurality of pairs of corresponding conductive line groups respectively belonging to the first sub-displaying region and the second sub-displaying region;
   a plurality of select wires electrically connected to the second conductive lines of a plurality of pairs of corresponding conductive line groups respectively belonging to the first sub-displaying region and the second sub-displaying region, wherein any one of the block wires and any one of the select wires are electrically connected to only one pair of corresponding conductive line groups at the same time.

4. The display according to claim 3, wherein the block wires and the select wires are disposed in a manner enabling the first sub-displaying region and the second sub-displaying region being scanned symmetrically at the same time.

5. The display according to claim 1, further comprising a flexible circuit board electrically connected to the first conductive lines, the second conductive lines and the third conductive lines, and the flexible circuit board is a chip-on-film (COF) board, a tape-automated bonding (TAB) board or a flexible printed circuit board.

6. The display according to claim 1, further comprising a wire, through which different third conductive lines are electrically connected to each other.

7. The display according to claim 1, wherein each of the pixel units comprises a plurality of electrode pairs, each of the electrode pairs comprises the pixel electrode and a counter electrode opposite to the pixel electrode, and the single output terminal of the AND gate is electrically connected to the pixel electrodes of the electrode pairs at the same time.

8. The display according to claim 1, wherein the display panel is an electrophoretic display panel or a liquid crystal display panel.

9. The display according to claim 1, being an electronic paper display.

10. A display, comprising:
a display panel comprising:
- a plurality of pixel units in an image-displaying region, wherein each of the pixel units comprises:
  - a first transistor;
  - a second transistor electrically connected to the first transistor in series; and
  - a pixel electrode electrically connected to a source/drain of the second transistor;
- a plurality of conductive line groups, each of the conductive line groups comprising:
  - a first conductive line electrically connected to a gate of each of the first transistors in a row; and
  - a second conductive line electrically connected to a gate of each of the second transistors in the row;
- a plurality of third conductive lines respectively electrically connected to a source/drain of each of the first transistors in a plurality of columns; and
- a wire in a peripheral region, the wire being connected to the first conductive lines of different conductive line groups at the same time, or connected to the second conductive lines of different conductive line groups at the same time, wherein the wire has an extending direction different from extending directions of the first conductive lines and the second conductive lines.

11. The display according to claim 10, wherein the image-displaying region comprises a first sub-displaying region and a second sub-displaying region, and the display panel further comprises:
- a block wire electrically connected to the first conductive lines of a pair of corresponding conductive line groups respectively belonging to the first sub-displaying region and the second sub-displaying region; and
- a select wire electrically connected to the second conductive lines of the pair of corresponding conductive line groups.

12. The display according to claim 10, wherein the image-displaying region comprises a first sub-displaying region and a second sub-displaying region, and the display panel further comprises:
- a plurality of block wires electrically connected to the first conductive lines of a plurality of pairs of corresponding conductive line groups respectively belonging to the first sub-displaying region and the second sub-displaying region; and
- a plurality of select wires electrically connected to the second conductive lines of a plurality of pairs of corresponding conductive line groups respectively belonging to the first sub-displaying region and the second sub-displaying region, wherein any one of the block wires and any one of the select wires are electrically connected to only one pair of corresponding conductive line groups at the same time.

13. The display according to claim 12, wherein the block wires and the select wires are disposed in a manner enabling the first sub-displaying region and the second sub-displaying region being scanned symmetrically at the same time.

14. The display according to claim 10, wherein the first transistor and the second transistor constitute an AND gate.

15. The display according to claim 10, wherein each of the pixel units comprises a plurality of electrode pairs, each of the electrode pairs comprises the pixel electrode and a counter electrode opposite to the pixel electrode, and the pixel electrodes of the electrode pairs are electrically connected the same source/drain of the second transistor at the same time.

* * * * *